US010332971B2

(12) United States Patent
Ando et al.

(10) Patent No.: US 10,332,971 B2
(45) Date of Patent: Jun. 25, 2019

(54) REPLACEMENT METAL GATE STACK FOR DIFFUSION PREVENTION

(71) Applicant: International Business Machines Corporation, Armonk, NY (US)

(72) Inventors: Takashi Ando, Tuckahoe, NY (US); Johnathan E. Faltermeier, Delanson, NY (US); Su Chen Fan, Cohoes, NY (US); Sivananda K. Kanakasabapathy, Niskayuna, NY (US); Injo Ok, Loudonville, NY (US); Tenko Yamashita, Schenectady, NY (US)

(73) Assignee: International Business Machines Corporation, Armonk, NY (US)

(*) Notice: Subject to any disclaimer, the term of this patent is extended or adjusted under 35 U.S.C. 154(b) by 5 days.

(21) Appl. No.: 15/826,346

(22) Filed: Nov. 29, 2017

(65) Prior Publication Data

US 2018/0083117 A1    Mar. 22, 2018

Related U.S. Application Data

(60) Continuation of application No. 15/068,218, filed on Mar. 11, 2016, now Pat. No. 9,905,665, which is a (Continued)

(51) Int. Cl.
*H01L 29/49* (2006.01)
*H01L 29/51* (2006.01)
*H01L 29/40* (2006.01)
*H01L 21/28* (2006.01)
*H01L 21/8234* (2006.01)
(Continued)

(52) U.S. Cl.
CPC .... *H01L 29/4966* (2013.01); *H01L 21/28088* (2013.01); *H01L 21/823431* (2013.01); *H01L 21/823456* (2013.01); *H01L 21/845* (2013.01); *H01L 27/088* (2013.01); *H01L 29/401* (2013.01); *H01L 29/42376* (2013.01); (Continued)

(58) Field of Classification Search
CPC .......... H01L 27/0251; H01L 27/14643; H01L 27/14689; H01L 29/4966
USPC ....................................................... 257/401
See application file for complete search history.

(56) References Cited

U.S. PATENT DOCUMENTS 5,639,316 A    6/1997  Cabral, Jr. et al.
7,868,410 B2   1/2011  Vereecken et al.
(Continued)

*Primary Examiner* — Mohammad M Choudhry
(74) *Attorney, Agent, or Firm* — Scully, Scott, Murphy & Presser, P.C.; Steven J. Meyers

(57) ABSTRACT

A method of forming a semiconductor structure includes depositing a gate dielectric layer lining a recess of a gate structure formed on a substrate with a first portion of the gate dielectric layer covering sidewalls of the recess and a second portion of the gate dielectric layer covering a bottom of the recess. A protective layer is deposited above the gate dielectric layer and then recessed selectively to the gate dielectric layer so that a top surface of the protective layer is below of the recess. The first portion of the gate dielectric layer is recessed until a top of the first portion of the gate dielectric layer is approximately coplanar with the top surface of the protective layer. The protective layer is removed and a conductive barrier is deposited above the recessed first portion of the gate dielectric layer to cut a diffusion path to the gate dielectric layer.

14 Claims, 14 Drawing Sheets

Related U.S. Application Data division of application No. 14/199,045, filed on Mar. 6, 2014, now Pat. No. 9,312,136.

(51) Int. Cl.
  *H01L 29/66* (2006.01)
  *H01L 27/088* (2006.01)
  *H01L 29/423* (2006.01)
  *H01L 21/84* (2006.01)

(52) U.S. Cl.
  CPC ...... *H01L 29/517* (2013.01); *H01L 29/66545* (2013.01); *H01L 29/66795* (2013.01)

(56) References Cited

U.S. PATENT DOCUMENTS

| | | | |
|---|---|---|---|
| 8,288,237 B2 | 10/2012 | Callegari et al. | |
| 8,354,719 B2 | 1/2013 | Choi et al. | |
| 8,410,559 B2 | 4/2013 | Li et al. | |
| 8,470,714 B1 | 6/2013 | Tsai | |
| 8,482,080 B2 | 7/2013 | Niimi et al. | |
| 8,729,627 B2 * | 5/2014 | Cheng | H01L 21/823807 257/330 |
| 2003/0011009 A1 * | 1/2003 | Zhang | H01L 21/823437 257/284 |
| 2005/0142715 A1 | 6/2005 | Sakoda et al. | |
| 2006/0046449 A1 * | 3/2006 | Liaw | H01L 21/76897 438/585 |
| 2006/0166474 A1 | 7/2006 | Vereecken et al. | |
| 2006/0175289 A1 * | 8/2006 | Jung | H01L 21/265 216/57 |
| 2007/0238273 A1 * | 10/2007 | Doyle | H01L 21/26586 438/525 |
| 2007/0281105 A1 * | 12/2007 | Mokhlesi | C23C 16/40 427/569 |
| 2008/0105918 A1 | 5/2008 | Jeon et al. | |
| 2010/0163968 A1 * | 7/2010 | Kim | H01L 27/11565 257/324 |
| 2012/0018730 A1 * | 1/2012 | Kanakasabapathy | H01L 29/66795 257/66 |
| 2012/0319214 A1 * | 12/2012 | Ma | H01L 21/823842 257/410 |
| 2013/0032900 A1 * | 2/2013 | Hou | H01L 29/517 257/411 |
| 2013/0134545 A1 | 5/2013 | Hook et al. | |
| 2014/0183632 A1 * | 7/2014 | Tseng | H01L 29/785 257/347 |
| 2014/0264480 A1 * | 9/2014 | Tsao | H01L 23/5384 257/288 |

* cited by examiner

REPLACEMENT METAL GATE STACK FOR DIFFUSION PREVENTION

BACKGROUND

The present invention generally relates to semiconductor devices and more particularly to fabricating semiconductor structures having a gate stack that may prevent unwanted diffusion to a gate dielectric interface.

Complementary Metal-oxide-semiconductor (CMOS) technology is commonly used for fabricating field effect transistors (FET) as part of advanced integrated circuits (IC), such as CPUs, memory, storage devices, and the like. Most common among these may be metal-oxide-semiconductor field effect transistors (MOSFET), in which a gate structure may be energized to create an electric field in an underlying channel region of a substrate, by which charge carriers are allowed to travel through the channel region between a source region and a drain region of the substrate. The gate structure may be formed above the channel region and may generally include a gate dielectric layer as a part of or underneath other gate elements. The gate dielectric layer may include an insulator material, which may prevent leakage currents from flowing into the channel region when a voltage is applied to a gate electrode, while allowing the applied voltage to set up a transverse electric field in the channel region in a controllable manner.

In a replacement metal gate (RMG) fabrication approach, a dummy gate may be formed in the substrate. The dummy gate may be patterned and etched from a polysilicon layer above the substrate, over a portion of one or more fins formed from the substrate. In some cases, the dummy gate may be formed surrounding a nanowire or above a semiconductor-on-insulator (SOI) substrate. Gate spacers may be formed on opposite sidewalls of the dummy gate. The dummy gate and the gate spacers may then be surrounded by an interlevel dielectric (ILD) layer. Later, the dummy gate may be removed from between the gate spacers, as by, for example, an anisotropic vertical etch process such as a reactive ion etch (RIE). This may create a recess between the gate spacers where a metal gate, or gate electrode, may then be formed. A gate dielectric layer may be generally configured below the metal gate, although one or more layers of workfunction metals may be generally located between the gate dielectric layer and the metal gate. This sequence of layers including the gate dielectric layer, the workfunction metals and the metal gate may be referred to as a metal gate stack.

SUMMARY

The ability to manufacture semiconductor structures including a high-k gate dielectric layer protected from unwanted diffusion may facilitate advancing the capabilities of current CMOS technology.

According to one embodiment of the present disclosure, a method of forming a semiconductor structure may include depositing a gate dielectric layer lining a recess of a gate structure formed on a substrate, a first portion of the gate dielectric layer covering sidewalls of the recess and a second portion of the gate dielectric layer covering a bottom of the recess. A protective layer may be deposited above the gate dielectric substantially filling the recess and then the protective layer may be selectively recessed to the gate dielectric layer until a top surface of the protective layer is below of the recess. The first portion of the gate dielectric layer may be recessed until a top of the first portion of the gate dielectric layer is approximately coplanar with the top surface of the protective layer. During the recessing of the first portion of the gate dielectric layer, the protective layer may protect the second portion of the gate dielectric layer. The protective layer may be removed and a conductive barrier may be deposited above the recessed first portion of the gate dielectric layer. A metal gate may be formed above the conductive barrier and a capping layer may be formed above the metal gate with the conductive barrier separating the capping layer from the recessed first portion of the gate dielectric layer.

According to another embodiment of the present disclosure, a semiconductor structure may include a gate structure formed above a substrate, the gate structure may include a metal gate above a conductive barrier, and a gate dielectric layer below the conductive barrier and a capping layer above the gate structure. The conductive barrier may separate the capping layer from the gate dielectric layer.

According to another embodiment of the present disclosure, a semiconductor structure may include a first gate structure and a second gate structure, with a length of the second gate structure being greater than a length of the first gate structure, and a capping layer above the first gate structure and the second gate structure. The first gate structure may include a first metal gate above a first conductive barrier, and a first gate dielectric layer below the first conductive barrier, with the first conductive barrier separating the capping layer from the first gate dielectric layer. The second gate structure may include a second metal gate above a second conductive barrier, and a second gate dielectric layer below the first conductive barrier, with the capping layer being in contact with the second gate dielectric layer.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

Figure 1:
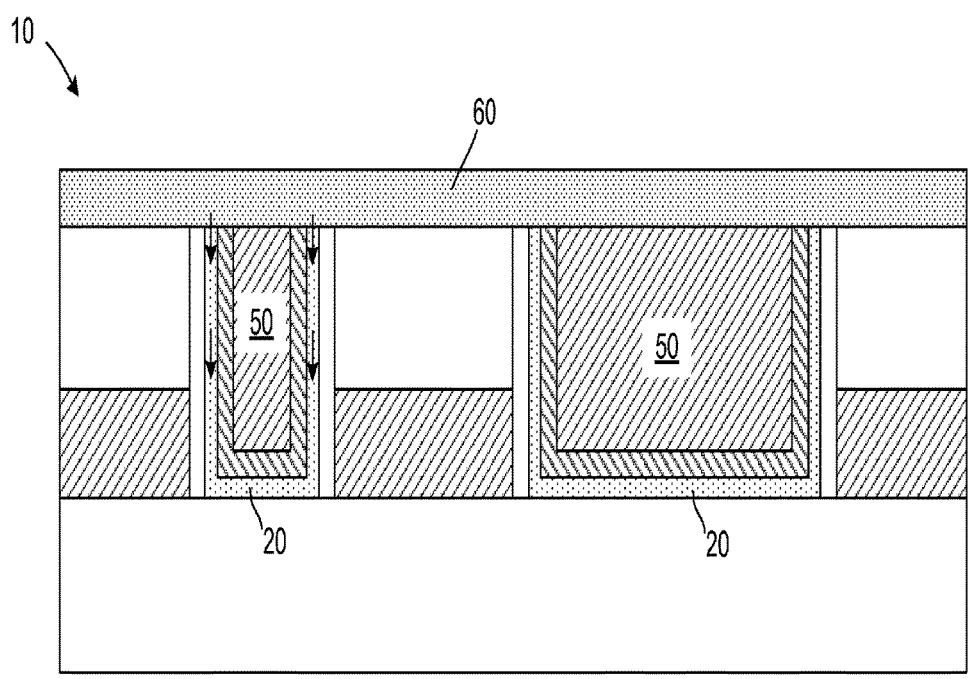
FIG. 1 is a cross-sectional view of a semiconductor structure depicting a typical gate stack configuration after a RMG process, according to the prior art.

As integrated circuits continue to scale downward in size, CMOS technology has focused on high-k dielectric materials having dielectric constants greater than that of silicon dioxide ($SiO_2$) as possible gate dielectric layers. However, unwanted diffusion from subsequently formed layers, especially of oxygen ($O_2$) atoms and hydroxide ($OH^-$) ions, may impact the functioning and effectiveness of the high-k dielectric materials forming the gate dielectric layer. When $O_2$ or/and $OH^-$ diffuse into the gate dielectric layer the threshold voltage and the effective workfunction of the system may be affected, thereby decreasing device performance. This problem may be particularly noticeable in FET devices including gate structures with a length less than or equal to 20 nm. For example, FIG. 1 is a cross-sectional view of a semiconductor structure 10 depicting a typical gate stack configuration after the replacement of a dummy gate (not shown) by a metal gate 50. As may be observed in FIG. 1, a diffusion path between a capping layer 60 and a gate dielectric layer 20 may be established allowing the diffusion of $O_2$ and $OH^-$ (indicated by arrows) from the capping layer 60 to the gate dielectric layer 20 which in turn may negatively affect the device threshold voltage and workfunction performance. Accordingly, improving the formation of gate stacks may prevent the diffusion of $O_2$ and $OH^-$ to the gate dielectric layer hence enhancing device performance and increasing product yield and reliability.

A method of forming a semiconductor structure including a conductive barrier that may reduce the diffusion of $O_2$ and $OH^-$ to the gate dielectric layer is described in detail below by referring to the accompanying drawings in FIGS. 2-14, in accordance with an illustrative embodiment of the present disclosure. According to an exemplary embodiment, $O_2$ and $OH^-$ diffusion to the gate dielectric layer may be reduced by recessing the gate dielectric layer prior to the deposition of a workfunction metal. The workfunction metal (hereinafter "conductive barrier") conductive barrier may be formed above the recessed gate dielectric layer acting as a barrier to block possible diffusion paths that may allow for the migration of $O_2$ and $OH^-$ to the gate dielectric layer. The conductive barrier may be conformally deposited above the recessed gate dielectric layer reducing the diffusion of $O_2$ and $OH^-$ from subsequently formed layers.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Figure 2:
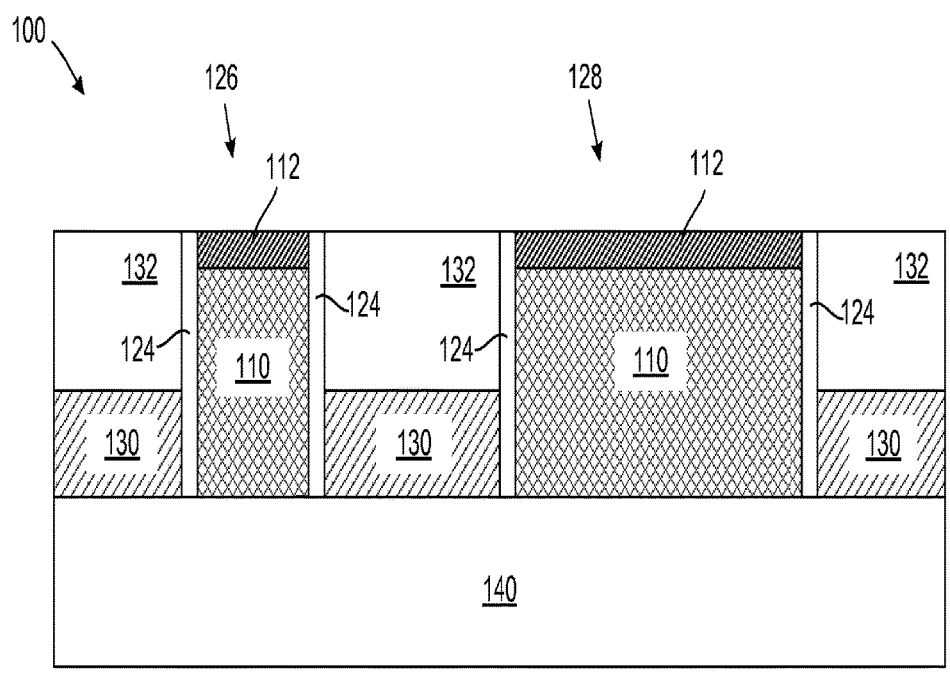
FIG. 2 is a cross-sectional view of a semiconductor structure including a dummy gate, according to an embodiment of the present disclosure.

Referring now to FIG. 2, a semiconductor structure 100 may be provided or fabricated. The semiconductor structure 100 may include dummy gates 110 above a substrate 140. Source-drain regions 130 may be adjacent to the substrate 140 on opposite sides of the dummy gates 110, separated from the dummy gates 110 by gate spacers 124. Hard masks 112 may cover a top surface of the dummy gates 110.

At this point of the manufacturing process, the semiconductor structure 100 may include one or more field effect transistor (FET) devices. For example, the semiconductor structure 100 may include a short-gate device 126 and a long-gate device 128. In an exemplary embodiment, the short gate device 126 may include a length varying between approximately 3 nm to approximately 20 nm, while the long-gate device 128 may include a length of approximately 50 nm to approximately 150 nm. In CMOS technology, gate structures of different lengths may be formed in a substrate in order to meet certain design requirements and to improve short-channel effect control. A constant threshold voltage (Vt) may be desired between short-gate devices and long-gate devices for optimal performance. However, owing to the length ratio between short-gate devices and long-gate devices, migration of $O_2$ and $OH^-$ to the high-k dielectric material forming the gate dielectric layer may have a stronger impact on short-gate devices causing a shift in the required Vt. In such cases, Vt variability between devices having different gate lengths may be considerable and may negatively affect the overall performance of the device.

In the depicted embodiment, the semiconductor structure 100 is a fin field effect transistor (finFET) so that the substrate 140 may be a semiconductor fin. In such embodiments, the substrate 140 may be a semiconductor-on-insulator (SOI) substrate, where a buried insulator layer (not shown) separates a base substrate (not shown) from a top semiconductor layer. The components of the semiconductor structure 100, including the semiconductor fin, may then be formed in or adjacent to the top semiconductor layer. In other embodiments, the substrate 140 may be a bulk substrate which may be made from any of several known semiconductor materials such as, for example, silicon, germanium, silicon-germanium alloy, carbon-doped silicon, carbon-doped silicon-germanium alloy, and compound (e.g. III-V and II-VI) semiconductor materials. Non-limiting examples of compound semiconductor materials include gallium arsenide, indium arsenide, and indium phosphide.

While embodiments depicted in FIGS. 2-14 refer to a finFET device, a person of ordinary skill in the art will understand that the method described will apply equally to planar SOI, ETSOI and/or nanowire devices.

The dummy gates 110 may have a height ranging from approximately 10 nm to approximately 200 nm, preferably approximately 50 nm to approximately 100 nm. The dummy gates 110 may include a sacrificial dielectric layer (not shown) and a sacrificial gate electrode (not shown). The sacrificial dielectric layer may be made of any known dielectric material such as silicon oxide or silicon nitride. The sacrificial gate electrode may be made of, for example, an amorphous or polycrystalline silicon material. Other suitable materials for the sacrificial dielectric layer and the sacrificial gate electrode known in the art may also be used. The sacrificial dielectric layer and the sacrificial gate electrode may be formed by any suitable deposition technique known in the art, including atomic layer deposition (ALD), chemical vapor deposition (CVD), physical vapor deposition (PVD), molecular beam deposition (MBD), pulsed laser deposition (PLD), or liquid source misted chemical deposition (LSMCD).

The hard masks 112 may be formed above the dummy gates 110 to protect the dummy gates 110 during subsequent fabrication processes. The hard masks 112 may be made of an insulating material, such as, for example, silicon nitride, silicon oxide, silicon oxynitrides, or a combination thereof, may have a thickness ranging from approximately 5 nm to approximately 50 nm, and may be formed by any suitable deposition technique known in the art, including ALD, CVD, PVD, MBD, PLD, or LSMCD.

Gate spacers 124 may be formed on sidewalls of the dummy gates 110. The gate spacers 124 may be made of any insulating material, such as silicon nitride, silicon oxide, silicon oxynitrides, or a combination thereof, and may have a thickness ranging from approximately 2 nm to approximately 100 nm, preferably approximately 2 nm to approximately 25 nm. The gate spacers 124 may be made of the same material as the hard masks 112. In a preferred embodiment, the hard masks 112 and the gate spacers 124 may be made of silicon nitride. The gate spacers 124 may be formed by any method known in the art, including depositing a conformal silicon nitride layer (not shown) over the dummy gates 110 and removing unwanted material from the conformal silicon nitride layer using a anisotropic etching process such as, for example, reactive ion etching (RIE) or plasma etching. Methods of forming spacers are well-known in the art and other methods are explicitly contemplated. Further, in various embodiments, the gate spacers 124 may include one or more layers. While the gate spacers 124 are herein described in the plural, the gate spacers 124 may consist of a single spacer surrounding the dummy gates 110.

The source-drain regions 130 may be formed on the substrate 140 adjacent to the gate spacers 124 on opposite sides of the dummy gates 110. While, the short-gate device 126 and the long-gate device 128 are depicted as adjacent and sharing a common gate, this may not be true of all embodiments. Numerous methods of forming source-drain regions are known in the art, any of which may be used to form the source-drain regions 130. In some embodiments, the source-drain regions 130 may be formed by doping portions of the substrate 140. In other embodiments, the source-drain regions 130 may be formed by growing epitaxial semiconductor regions adjacent to the substrate 140. The epitaxial semiconductor regions may extend above and/or below the top surface of the substrate 140 as shown.

With continued reference to FIG. 2, an ILD layer 132 may deposited above the semiconductor structure 100. The ILD layer 132 may fill the gaps between two adjacent devices, such as the short-gate device 126 and the long-gate device 128, and other existing devices within the semiconductor structure 100. The ILD layer 132 may include any suitable dielectric material, for example, silicon oxide, silicon nitride, hydrogenated silicon carbon oxide, silicon based low-k dielectrics, flowable oxides, porous dielectrics, or organic dielectrics including porous organic dielectrics and may be formed using any suitable deposition techniques including ALD, CVD, plasma enhanced CVD, spin on deposition, or PVD. In some embodiments, various barriers or liners (not shown) may be formed below the ILD layer 132. The ILD layer 132 may be thinned, for example by a chemical mechanical planarization/polish (CMP) technique, so that a top surface of the ILD layer 132 may be approximately coplanar with a top surface of the short-gate device 126 and the long-gate device 128. After CMP, the ILD layer 132 may have a thickness ranging from approximately 10 nm to approximately 120 nm.

Figure 3:
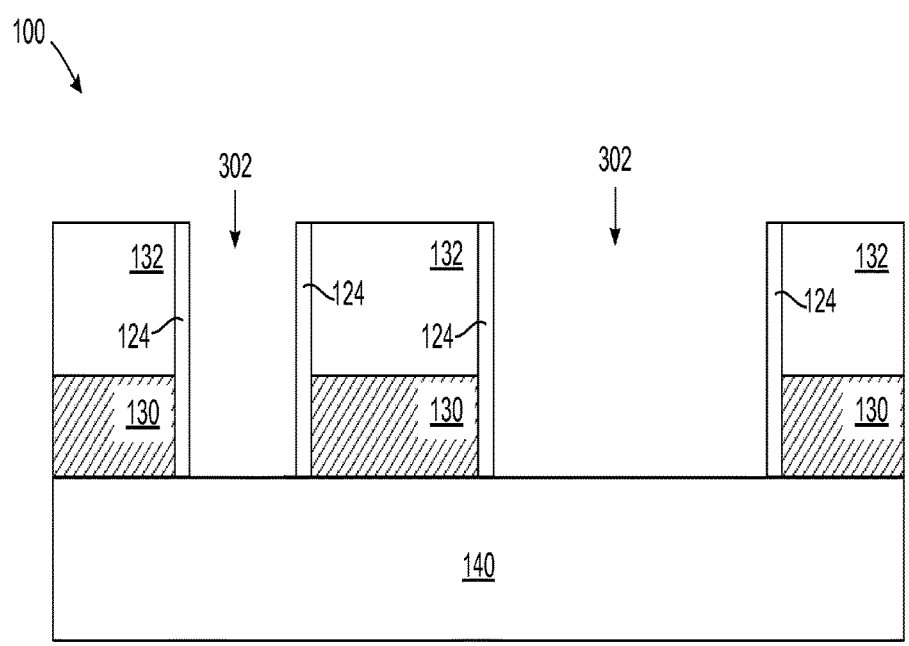
FIG. 3 is a cross-sectional view of a semiconductor structure depicting removing the dummy gate, according to an embodiment of the present disclosure.

Referring now to FIG. 3, the hard masks 112 (FIG. 2) and the dummy gates 110 (FIG. 2) may be removed. Removal of the hard masks 112 (FIG. 2) and the dummy gates 110 (FIG. 2) may create first gate recesses 302. The hard mask 112 (FIG. 2) and the dummy gates 110 (FIG. 2) may be removed by any suitable etching process known in the art capable of selectively removing the hard masks 112 and the dummy gates 110 without substantially removing material from the gate spacers 124 or the ILD layer 132. In an exemplary embodiment, the dummy gates 110 (FIG. 2) may be removed, for example, by a reactive ion etching (RIE) process capable of selectively removing silicon to remove the sacrificial gate electrode (not shown) and a hydrofluoric acid-containing wet etch to remove the sacrificial gate dielectric layer (not shown).

Figure 4:
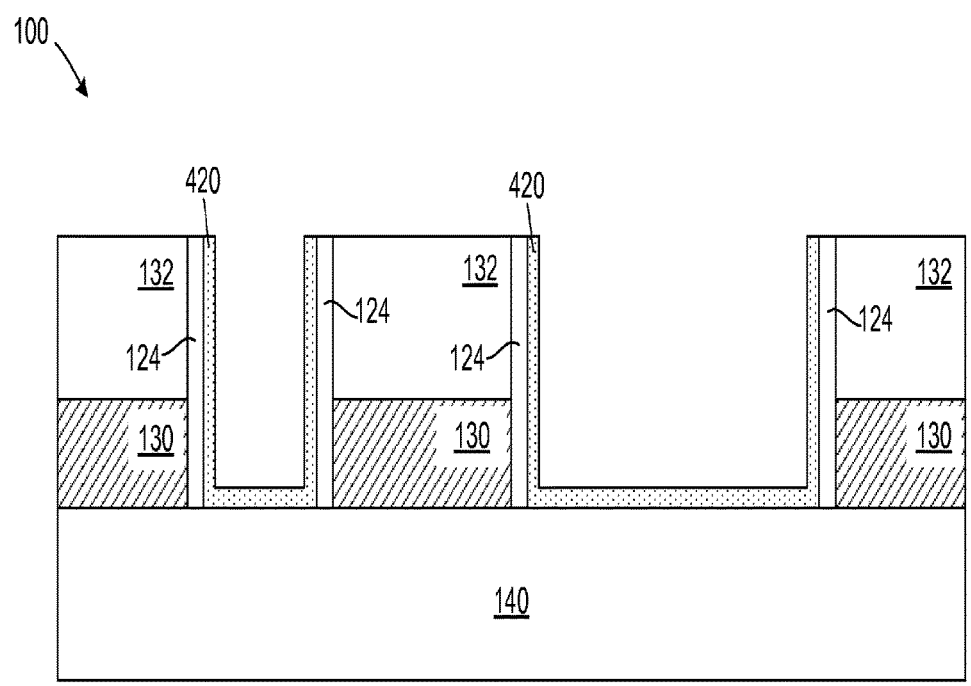
FIG. 4 is a cross-sectional view of a semiconductor structure depicting the formation of a gate dielectric layer, according to an embodiment of the present disclosure.

Referring now to FIG. 4, gate dielectric layers 420 may be formed within the first gate recesses 302 (FIG. 3). The gate dielectric layers 420 may include an insulating material including, but not limited to: oxide, nitride, oxynitride or silicate including metal silicates and nitrided metal silicates. In some embodiments, the gate dielectric layers 420 may include an oxide such as, for example, $SiO_2$, $HfO_2$, $ZrO_2$, $Al_2O_3$, $TiO_2$, $La_2O_3$, $SrTiO_3$, $LaAlO_3$, and mixtures thereof. In an exemplary embodiment, the gate dielectric layers 420 may include hafnium oxide ($HfO_2$). The physical thickness of the gate dielectric layers 420 may vary, but typically the gate dielectric layers 420 may have a thickness ranging from approximately 0.5 nm to approximately 10 nm. More preferably the gate dielectric layers 420 may have a thickness ranging from approximately 0.5 nm to approximately 3 nm. The gate dielectric layers 420 may be formed by any suitable deposition technique known in the art, such as, for example, CVD, plasma-assisted CVD, ALD, evaporation, reactive sputtering, chemical solution deposition or other like deposition processes.

Figure 5:
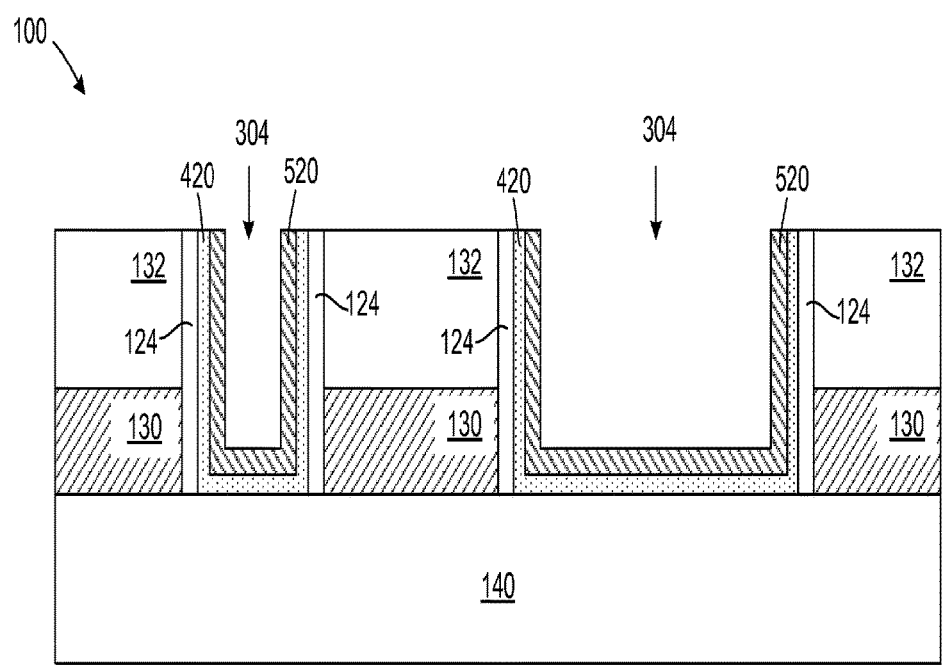
FIG. 5 is a cross-sectional view of a semiconductor structure depicting the formation of a sacrificial layer, according to an embodiment of the present disclosure.

Referring now to FIG. 5, sacrificial layers 520 may be conformally deposited above the gate dielectric layers 420. The sacrificial layers 520 may protect the gate dielectric layers 420 during etching of a protective layer 630 shown in FIG. 8. In embodiments where the annealing ambient is inert, formation of the sacrificial layer 520 may not be required. The sacrificial layer 520 may include any suitable workfunction metal such as Zr, W, Ta, Hf, Ti, Al, Ru, Pa, metal oxide, metal carbide, metal nitride, transition metal aluminides (e.g. Ti3Al, ZrAl), TaC, TiC, TaMgC), and any combination of those materials. In one embodiment the sacrificial layer 520 may include titanium nitride (TiN). The sacrificial layer 520 may have a thickness ranging from approximately 0.5 nm to approximately 100 nm. The sacrificial layer 520 may be deposited by any suitable deposition method known in the art such as CVD or ALD. Deposition of the sacrificial layer 520 may form second gate recesses 304 above the sacrificial layer 520.

Figure 6:
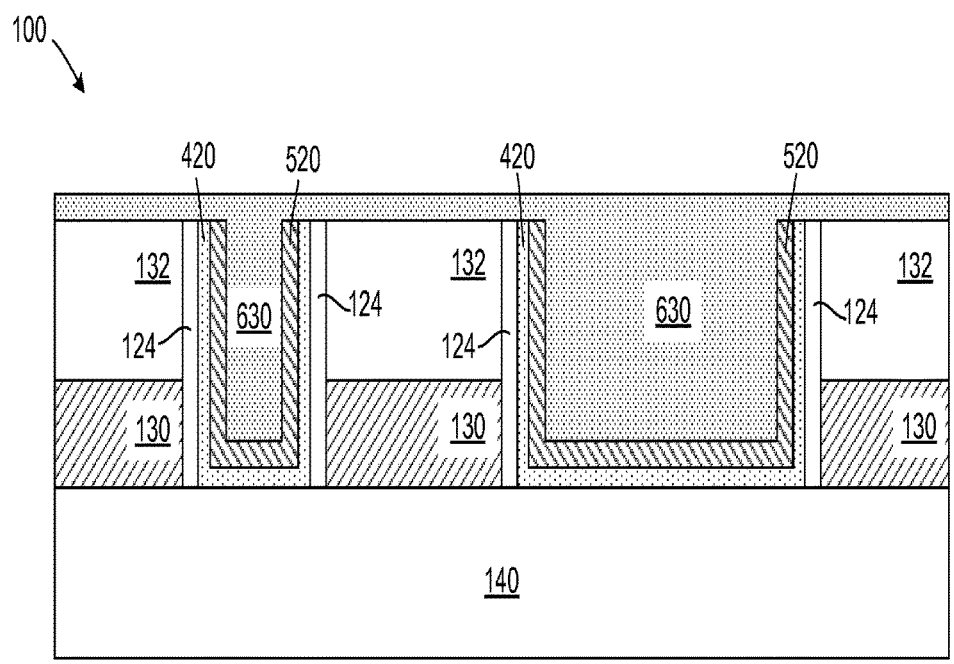
FIG. 6 is a cross-sectional view of a semiconductor structure depicting the formation of a protective layer, according to an embodiment of the present disclosure.

Referring now to FIG. 6, a protective layer 630 may be blanket deposited above the semiconductor structure 100. The protective layer 630 may substantially fill the second gate recesses 304 (FIG. 5). The protective layer 630 may protect the long-gate device 128 (FIG. 2) during subsequent processing steps. Since changes in Vt have been primarily observed in short-gate devices, any device including a gate structure with a length greater than or equal to 50 nm may need to be covered by the protective layer 630 in order to continue with the processing steps. The protective layer 630 may include any suitable organic spin material. In one embodiment, the protective layer 630 may include an optical planarizing layer (OPL) or spin-on carbon layer. The protective layer 630 may be deposited by any suitable deposition method known in the art such as CVD or reflowable carbon layer. It should be noted that the material selected to form the protective layer 630 may be able to fill the second gate recesses 304 (FIG. 5) in the short-gate device 126 (FIG. 2). More specifically, the material forming the protective layer 630 may be capable of substantially fill any recess having a width of approximately 1 nm or less and a depth of approximately 120 nm.

Figure 7:
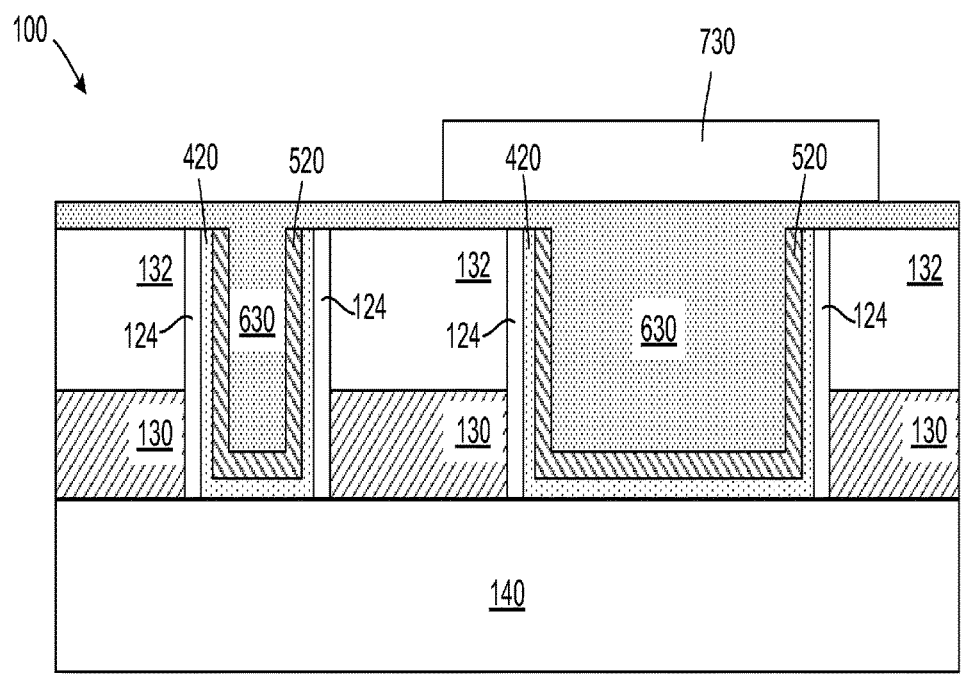
FIG. 7 is a cross-sectional view of a semiconductor structure depicting the formation of a masking layer, according to an embodiment of the present disclosure.

Referring now to FIG. 7, a masking layer 730 may be formed above the protective layer 630, covering an area corresponding to the long-gate device 128 (FIG. 2). The masking layer 730 may protect the long-gate device 128 (FIG. 2) during subsequent etching of the protective layer 630 described in FIG. 8. The steps involved in forming the masking layer 730 are typical and well known to those skilled in the art.

Figure 8:
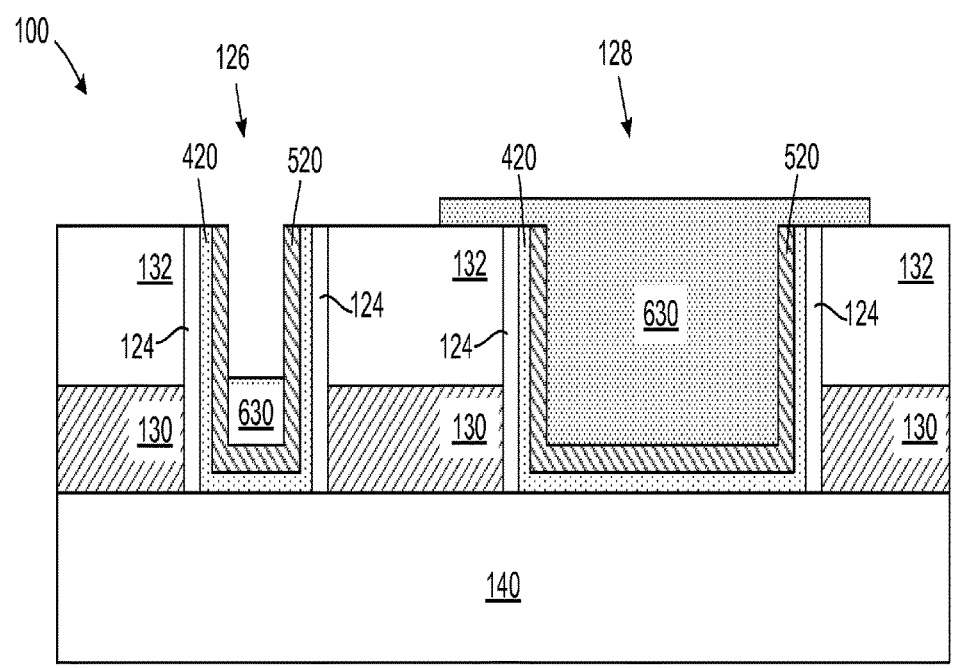
FIG. 8 is a cross-sectional view of a semiconductor structure depicting partially removing the protective layer, according to an embodiment of the present disclosure.
Figure 9:
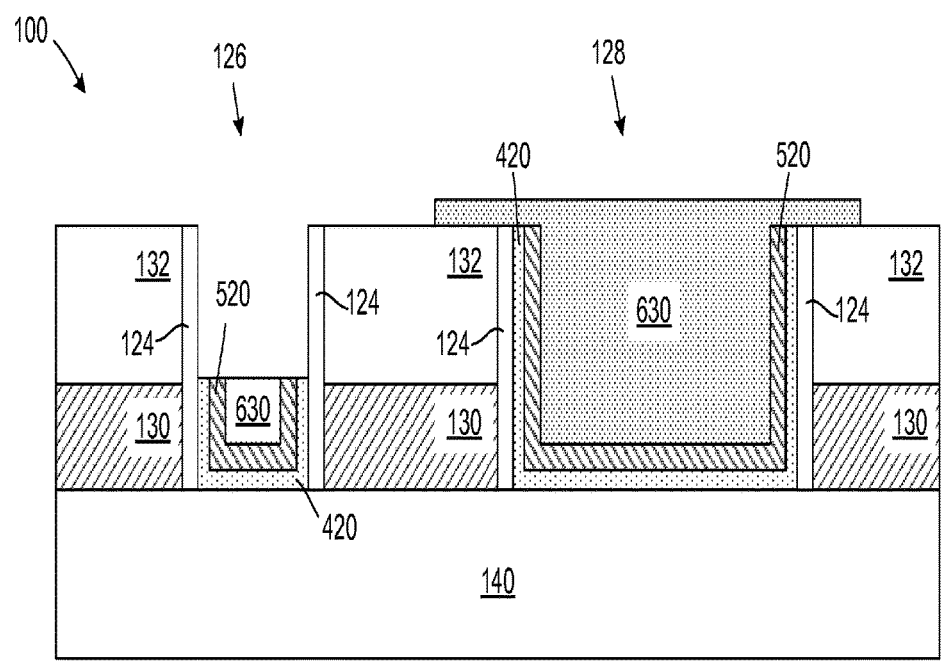
FIG. 9 is a cross-sectional view of a semiconductor structure depicting the recessing of the gate dielectric layer and the sacrificial layer, according to an embodiment of the present disclosure.

Referring now to FIG. 8, the protective layer 630 in the short-gate device 126 may be recessed. The protective layer 630 may be partially removed from the short-gate device 126, so that a portion of the protective layer 630 may remain within the short-gate device 126. The height of the remaining portion of the protective layer 630 within the short-gate device 126 may act as an etch-stop indicator during subsequent recessing of the gate dielectric layer 420 and the sacrificial layer 520 in the short-gate device 126 (FIG. 9). The remaining portion of the protective layer 630 within the short-gate device 126 may have a height ranging from approximately 1 nm to approximately 100 nm. A dry-etch process may be conducted to partially remove the protective layer 630 from the short-gate device 126, although any other suitable etching technique may also be considered. In an exemplary embodiment where the protective layer 630 is spin-on carbon, the protective layer 630 may be removed by, for example, a dry etch chemistry including $N_2$, $H_2$ and $CHF_3$. After partially removing the protective layer 630 from the short-gate device 126, the masking layer 730 (FIG. 7) may now be removed. The steps involved in removing the masking layer 730 (FIG. 7) are typical and well known to those skilled in the art.

Referring now to FIG. 9, the gate dielectric layer 420 and the sacrificial layer 520 in the short-gate device 126 may be recessed. The protective layer 630 may protect the long-gate device 128 during etching of the gate dielectric layer 420 and the sacrificial layer 520 in the short-gate device 126 to prevent recessing the gate dielectric layer 420 and the sacrificial layer 520 in the long-gate device 128. The gate dielectric layer 420 and the sacrificial layer 520 may be recessed until they are approximately coplanar with the remaining portion of the protective layer 630 within the short-gate device 126. The gate dielectric layer 420 and the sacrificial layer 520 may be recessed selectively to the protective layer 630 by means of any suitable etching technique known in the art. In an exemplary embodiment where the protective layer 630 is spin-on carbon, the gate dielectric layer 420 is $HfO_2$ and the sacrificial layer 520 is TiN, the gate dielectric layer 420 and the sacrificial layer 520 may be recessed by, for example, a dry etch chemistry including $N_2$, $H_2$ and $CHF_3$.

Figure 10:
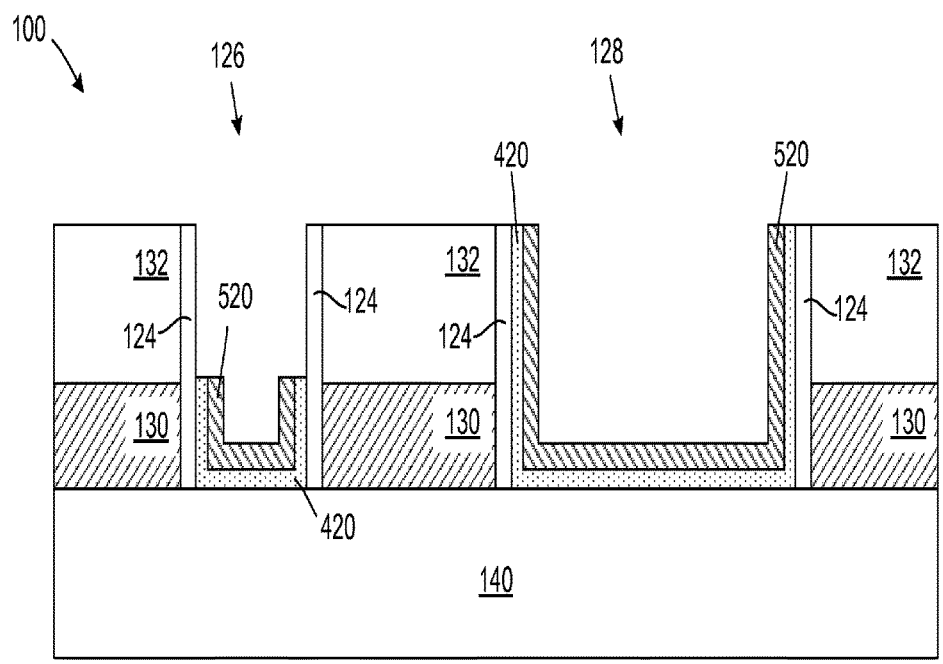
FIG. 10 is a cross-sectional view of a semiconductor structure depicting the removal of the protective layer, according to an embodiment of the present disclosure.

Referring now to FIG. 10, the protective layer 630 (FIG. 9) may be removed from the short-gate device 126 and the long-gate device 128. In this embodiment, the sacrificial layer 520 may protect the gate dielectric layers 420 during removal of the protective layer 630. The protective layer 630 (FIG. 9) may be removed by means of any suitable etching technique. In an exemplary embodiment where the protective layer 630 (FIG. 9) is spin-on carbon, the protective layer 630 may be removed by, for example, a dry etch chemistry including $N_2$, $H_2$ and $CHF_3$.

Figure 11:
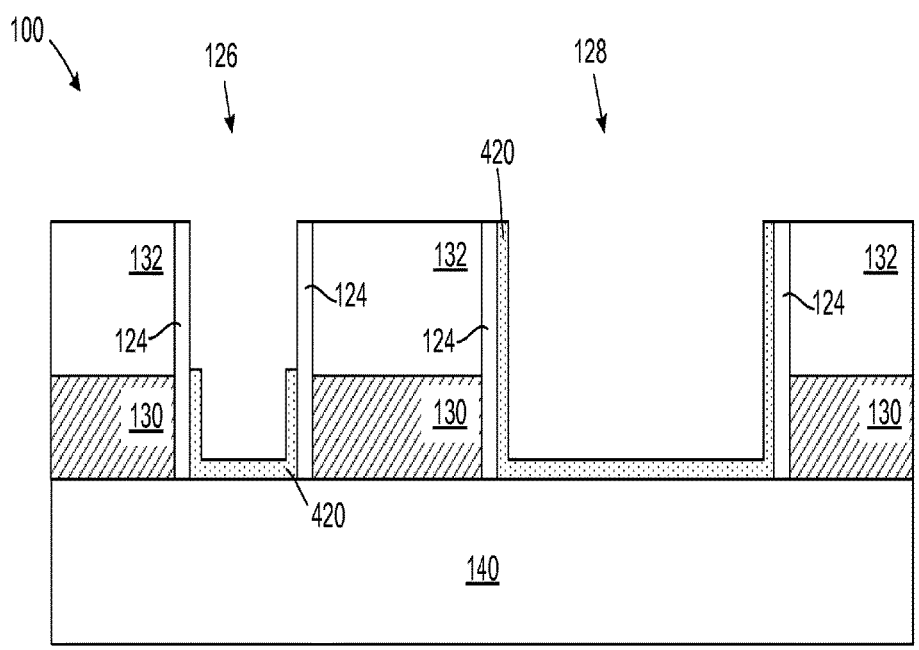
FIG. 11 is a cross-sectional view of a semiconductor structure depicting the removal of the sacrificial layer, according to an embodiment of the present disclosure.

Referring now to FIG. 11, the sacrificial layers 520 (FIG. 10) may be removed from the short-gate device 126 and the long-gate device 128 to expose the gate dielectric layers 420 in the short-gate device 126 and the long-gate device 128. Any suitable etching technique may be used to remove the sacrificial layers 520 (FIG. 10) from the short-gate and the long-gate devices 126, 128. In an exemplary embodiment where the sacrificial layers 520 are TiN and the gate dielectric layers 420 are $HfO_2$, the sacrificial layers 520 may be removed by, for example, a wet etch mixture of $NH_4OH$ and $H_2O_2$.

Figure 12:
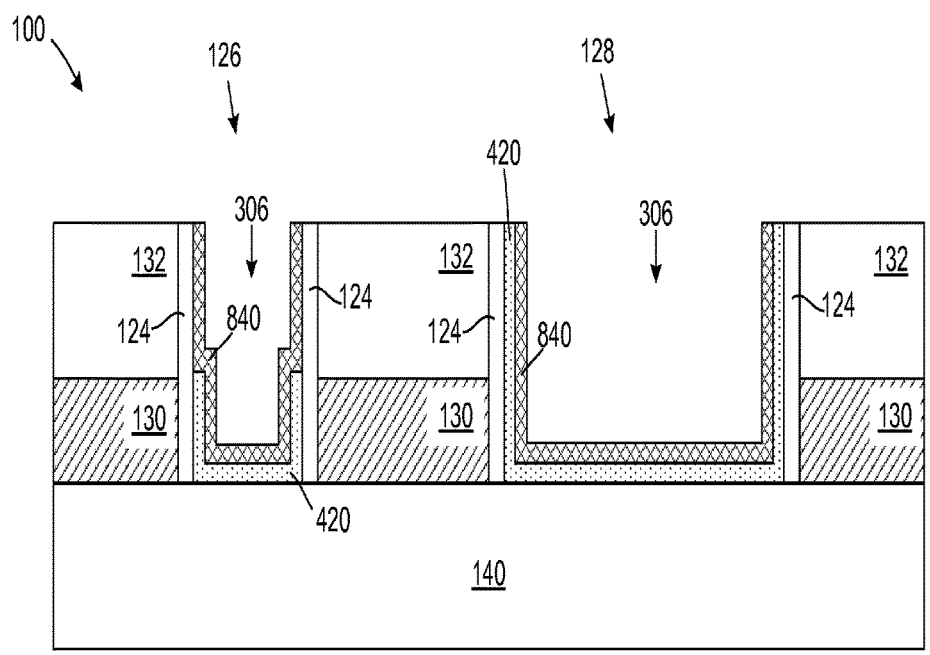
FIG. 12 is a cross-sectional view of a semiconductor structure depicting the formation of a conductive barrier, according to an embodiment of the present disclosure.

Referring now to FIG. 12, conductive barriers 840 may be conformally deposited above the gate dielectric layers 420 in the short-gate device 126 and the long-gate device 128. The conductive barrier 840 in the short-gate device 126 may substantially cover a top surface of the recessed gate dielectric layer 420 in the short-gate device 126 which may in turn eliminate any diffusion path between a subsequently formed capping layer 960 (FIG. 14) and the gate dielectric layer 420 in the short-gate device 126. The conductive barriers 840 may include any suitable workfunction metal including, but not limited to, Zr, W, Ta, Hf, Ti, Al, Ru, Pa, metal oxide, metal carbide, metal nitride, transition metal aluminides (e.g. Ti3Al, ZrAl), TaC, TiC, TaMgC), and any combination of those materials. In one exemplary embodiment the conductive barriers 840 may include TiN and TiC. The conductive barriers 840 may have a thickness ranging from approximately 2 nm to approximately 100 nm. The conductive barriers 840 may be deposited by any suitable deposition technique known in the art, for example by ALD, CVD, PVD, MBD, PLD, or LSMCD. Deposition of the conductive barriers 840 may form third gate recesses 306 above the conductive barrier 840.

Figure 13:
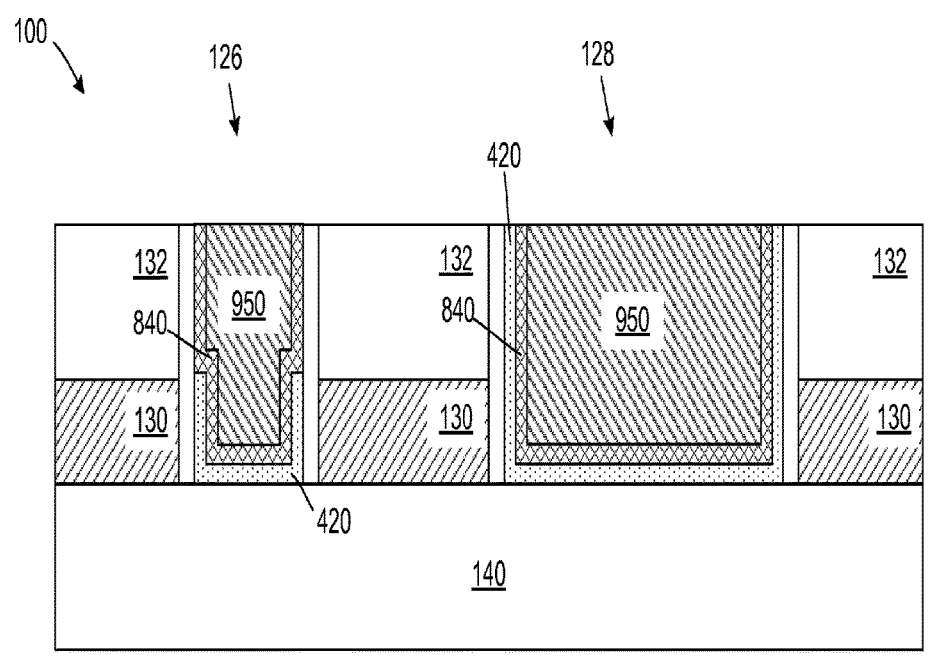
FIG. 13 is a cross-sectional view of a semiconductor structure depicting the formation of a metal gate, according to an embodiment of the present disclosure.

Referring now to FIG. 13, metal gates 950 may be deposited above the conductive barriers 840 substantially filling the third gate recesses 306 within the short-gate device 126 and the long-gate device 128. The metal gates 950 may include a metal with lower resistivity (higher conductivity) than the conductive barriers 840. In one embodiment, the metal gates 950 may include tungsten (W) or aluminum (Al). A CMP process may be conducted to remove excessive materials from the semiconductor structure 100 so that a top surface of the metal gates 950 may be substantially coplanar with a top surface of the ILD layer 132.

Figure 14:
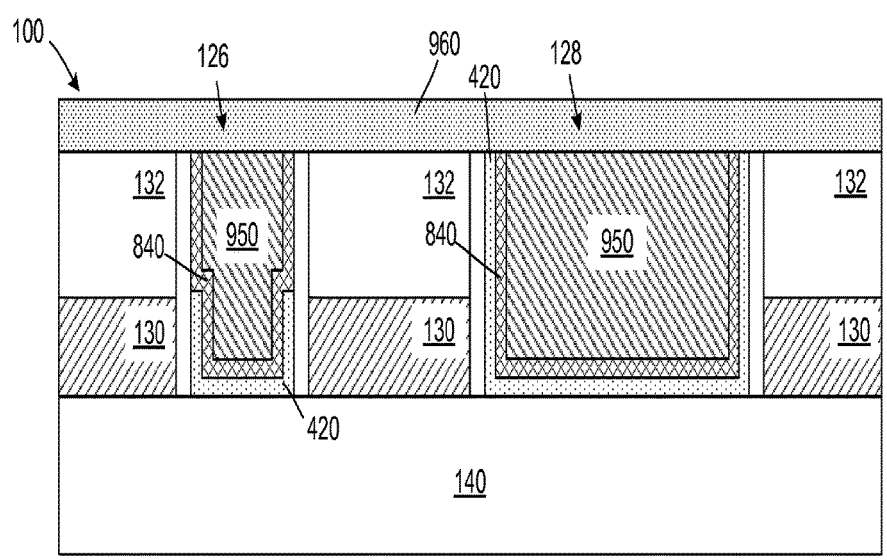
FIG. 14 is a cross-sectional view of a semiconductor structure depicting the formation of a capping layer, according to an embodiment of the present disclosure.

Referring now to FIG. 14, a capping layer 960 may be formed above the short-gate device 126 and the long-gate device 128. The capping layer 960 may be made of substantially the same material as the gate spacers 124 (FIG. 12). In some embodiments, the capping layer 960 may include silicon nitride and may have a thickness ranging from approximately 15 nm to approximately 45 nm. The capping layer 960 may be formed by any deposition method known in the art, for example, by CVD or ALD. It should be noted that by recessing the gate dielectric layer 420 in the short-gate device 126 prior to forming the conductive barriers 840, any possible $O_2$ and $OH^-$ diffusion path between the capping layer 960 and the gate dielectric layer 420 in the short-gate device 126 may be eliminated.

Therefore, recessing the gate dielectric layer 420 prior to forming the conductive barrier 840, particularly in short-gate devices may substantially block diffusion paths that may allow the migration of $O_2$ and $OH^-$ from the capping layer 960 to the gate dielectric layer 420. As a result, the threshold voltage and the workfunction of the system may not be affected by the diffusion of $O_2$ or/and $OH^-$ to the gate dielectric layer 420 in the short-gate device 126 enhancing device performance and increasing product yield and reliability, and the diffusion path from the capping layer 960 to the gate dielectric layer 420 may be cut without changing the traditional gate stack configuration which may improve process cost-effectiveness.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

The invention claimed is:

1. A semiconductor structure comprising:
   a gate structure formed above a substrate and contacting a sidewall of a gate spacer, the gate structure comprising:
   a metal gate above a conductive barrier that is in direct physical contact with an upper portion of the gate spacer, wherein the conductive barrier, the gate spacer, and the metal gate have topmost surfaces that are coplanar with each other;
   a gate dielectric layer below the conductive barrier, wherein the gate dielectric layer is U-Shaped having a topmost surface that is entirely beneath the topmost surfaces of each of the conductive barrier, the gate spacer, and the metal gate and wherein an outer vertical sidewall of the gate dielectric layer is in direct physical contact with a lower portion of the gate spacer; and
   a capping layer above the gate structure and located directly on the topmost surface of each of the gate spacer, the conductive barrier and the metal gate, wherein the conductive barrier separates the capping layer from the gate dielectric layer.

2. The semiconductor structure of claim 1, wherein the gate structure comprises a length less than 20 nm.

3. The semiconductor structure of claim 1, wherein the conductive barrier comprises an n-type workfunction metal.

4. The semiconductor structure of claim 1, wherein the gate dielectric layer comprises a high-k dielectric material.

5. The semiconductor structure of claim 1, wherein the gate dielectric layer has a vertical portion and a horizontal portion, the vertical portion of the gate dielectric layer having a height less than a height of the metal gate measured from a top surface of the substrate.

6. The semiconductor structure of claim 5, wherein the height of the vertical portion of the gate dielectric layer is within a range from 1 nm to 100 nm.

7. The semiconductor structure of claim 5, wherein the vertical portion of the gate dielectric layer comprises a first vertical portion and a second vertical portion, and wherein upper surfaces of the first vertical portion and the second vertical portion of the gate dielectric layer are coplanar to each other.

8. The semiconductor structure of claim 5, wherein a topmost surface of the horizontal portion of the gate dielectric layer directly contacts a bottommost surface of the conductive barrier.

9. The semiconductor structure of claim 1, wherein the substrate is a semiconductor fin.

10. The semiconductor structure of claim 1, wherein the conductive barrier is composed of Zr, W, Ta, Hf, Ti, Al, Ru, Pa, a metal oxide, a metal carbide, a metal nitride, a transition metal aluminide, or any combination thereof.

11. The semiconductor structure of claim 10, wherein the conductive barrier is composed of $Ti_3Al$, ZrAl, TaC, TiC, TaMgC, TiN or TiC.

12. The semiconductor structure of claim 1, wherein the metal gate is composed of a metal having a lower resistivity than the conductive barrier.

13. The semiconductor structure of claim 1, further comprising an interlayer dielectric material surrounding at least an upper portion of the gate structure.

14. The semiconductor structure of claim 1, wherein the conductive barrier covers the entirety of the U-shaped gate dielectric material layer.

* * * * *